United States Patent [19]

Spohrer et al.

[11] Patent Number: 4,902,919
[45] Date of Patent: Feb. 20, 1990

[54] **INVERTING LATCHING BOOTSTRAP DRIVER WITH $V_{dd}*2$ BOOTING**

[75] Inventors: Thomas S. Spohrer; Bernard C. Dewitt, both of Austin, TX.

[73] Assignee: Motorola, Inc., Schaumburg, Ill.

[21] Appl. No.: 248,883

[22] Filed: Sep. 26, 1988

[51] Int. Cl.$^4$ ............................................. H03K 17/10
[52] U.S. Cl. .................... 307/482; 307/443; 307/452; 307/578
[58] Field of Search ............... 307/443, 448, 452, 453, 307/481, 482, 578

[56] References Cited

U.S. PATENT DOCUMENTS

| | | | |
|---|---|---|---|
| 4,494,018 | 1/1985 | Clemen et al. | 307/482 |
| 4,622,479 | 11/1986 | Taylor | 307/482 |
| 4,633,106 | 12/1986 | Backes et al. | 307/482 |
| 4,679,214 | 7/1989 | Takemae | 307/482 |
| 4,680,488 | 7/1987 | Okumura et al. | 307/482 |
| 4,725,746 | 2/1988 | Segawa et al. | 307/482 |

FOREIGN PATENT DOCUMENTS

| | | | |
|---|---|---|---|
| 2261721 | 6/1973 | Fed. Rep. of Germany | 307/482 |
| 58-35867 | 9/1984 | Japan | 307/482 |
| 58231235 | 7/1985 | Japan | 307/482 |

Primary Examiner—David Hudspeth
Assistant Examiner—Terry D. Cunningham
Attorney, Agent, or Firm—Robert L. King

[57] ABSTRACT

An inverting latching bootstrap driver is used to drive a load where the input to the driver may change during the driving phase. The input to the driver circuit is controlled by a precharge/discharge type decoder. The bootstrap driver samples the input during the same phase the decoder discharges, and isolates the input while the decoder precharges. Accordingly, the decoder is precharged during the same phase that the bootstrap output is driven. The circuit implementation uses a transistor in series with the enhancement device of the inverter to disable the inverter while the bootstrap is fired. Since the device used to isolate the booting charge is a depletion mode device, the booting node will be able to rise to a full $V_{DD}*2$.

5 Claims, 1 Drawing Sheet

INVERTING LATCHING BOOTSTRAP DRIVER WITH $V_{dd}*2$ BOOTING

FIELD OF THE INVENTION

The present invention relates generally to a load driving circuit, and more specifically to a circuit and method for using a bootstrap type driver to drive a load where the input to the driver may change during the driving phase.

BACKGROUND OF THE INVENTION

In some applications, it is desirable to use a precharge/discharge type decoder to control the input of a driver circuit. Although a typical bootstrap type driver circuit is ideal for driving a large load relatively efficiently, it suffers from the limitation that the input can not change while it is driving the load high. Consequently, this characteristic of the typical bootstrap type driver circuit precludes its use directly with a precharge/discharge type decoder.

In the prior art are designs which attempt to overcome the limitation of the typical bootstrap driver circuit. One previous approach was to use an enhancement transistor to trap the charge at the booting node. This design approach limits the output drive characteristics of the device, since the optimum voltage on the booting node is only $(V_{DD}-V_T)*2$ instead of a full $V_{DD}*2$. Another approach is to use a discrete latch before the bootstrap driver, however, this solution requires considerable silicon area, and significantly increases the amount of propagation delay.

SUMMARY OF THE INVENTION

It is therefore an object of the present invention to provide an improved bootstrap driver.

It is further an object of the present invention to provide an improved bootstrap driver which will allow the input to change while the circuit is driving the load high.

It is yet another object of the present invention to provide an improved bootstrap driver which is readily integrable with an integrated circuit such as a microprocessor utilizing a minimum number of components and on-chip area.

These and other objects of the present invention are accomplished in a bootstrap driver circuit with $V_{DD}*2$ booting for driving an output node in response to an input signal on an input node, comprising a bootstrapped driver coupled between said input node and said output node and having a bootstrap node, for precharging said bootstrap node in response to said input signal during a precharge phase, and driving said output node in proportion to the charge on said bootstrap node during a drive phase. In accordance with the present invention, an inverting latching buffer, interposed between the driver and the input node, couples the driver to the input node only during the precharge phase.

DETAILED DESCRIPTION OF A PREFERRED EMBODIMENT

Figure 1:
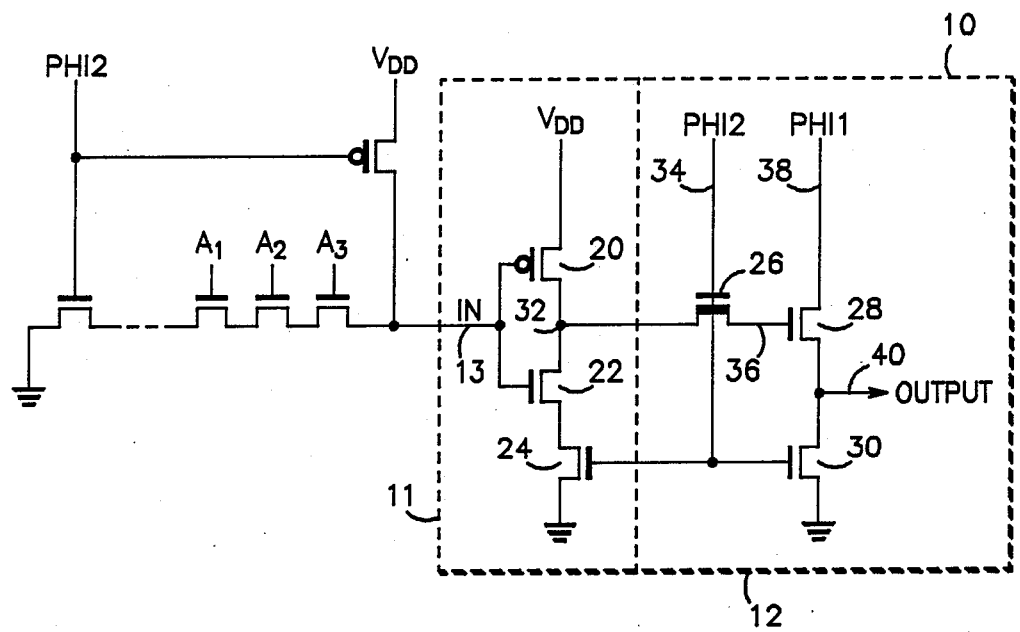
FIG. 1 is a logic diagram of an inverting latching bootstrap driver with $V_{DD}*2$ booting in accordance with the present invention.

Shown in the FIG. 1 is a latching bootstrap driver 10 with $V_{DD}*2$ booting in accordance with the present invention. The driver 10 is comprised generally of an inverting latching buffer 11, and a core driver 12. In the preferred form, inverting latching buffer 11 is comprised of a P channel transistor 20, an N channel transistor 22, and an N channel transistor 24. In the illustrated form, the core driver 12 is comprised of a depletion mode transistor 26, and N channel transistors 28 and 30.

Transistor 20 has a source connected to a positive power supply terminal $V_{DD}$, a drain connected to a node 32, and a gate for receiving an input signal (IN) at a node 13. Transistor 22 has a drain connected to node 32, a gate coupled to the gate of transistor 20, and a source. Transistor 24 has a drain connected to the source of transistor 22, a gate for receiving an input clock signal PHI2, and a source connected to a negative power supply terminal, shown as ground. Transistor 26 has a gate connected to the input clock signal PHI2 at node 34, a source connected to the drains of transistor 20 and transistor 22 at node 32, and a drain connected to a booting node 36. Transistor 28 has a source connected to an input clock signal PHI1, a gate connected to the drain of transistor 26, and a drain for providing a bootstrap output. Transistor 30 has a drain connected to the drain of transistor 28, a gate for receiving the PHI2 signal, and a source connected to ground.

The driver 10 samples the input node 13 during the same phase that the decoder discharges, and isolates the input node 13 while the decoder precharges. Since the decoder must be precharged during the same phase that the bootstrap output is being driven, transistor 24 is used to tristate the output of the input stage without effecting the booting node 36. Transistors 20 and 22 buffer and invert IN, while transistor 24 clocks the sampling of IN. These three transistors create a partially isolating inverting buffer.

Figure 2:
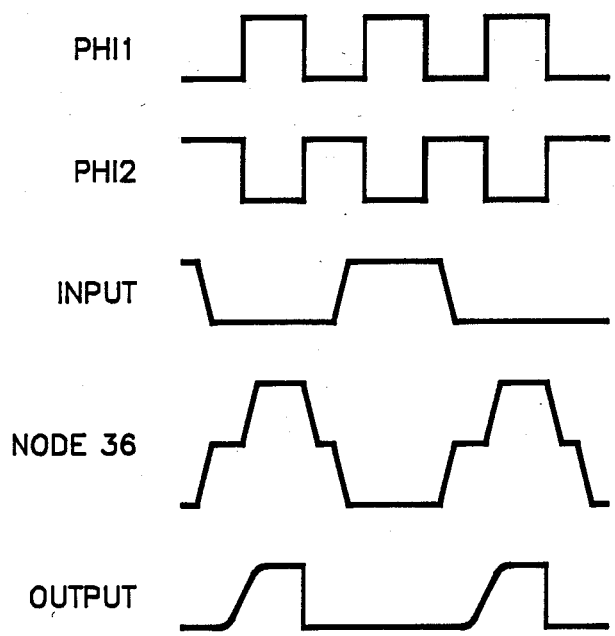
FIG. 2 is a timing diagram useful for understanding the operation of the circuitry of FIG. 1.

Shown in FIG. 2 is a timing diagram for the bootstrap driver 10. In the case where the IN at node 13 is pulled low, a sufficient setup time before the clock input PHI2 switches low and PHI1 switches high, node 36 is fully charged to $V_{DD}$ through the depletion transistor 26. When the clock input signal PHI2 switches low, shutting off transistor 26, and PHI1 switches high, node 36 is bootstrapped by the coupling of the source to the gate and drain to the gate of transistor 28. As the voltage at node 36 increases, transistor 26 will remain off for as long the voltage at node 32 stays at a $V_{DD}$ potential. Node 36 reaches $V_{DD}*2$ due to the coupling between node 36 and node 38 when clock signal PHI2 goes low, shutting off transistor 26, as PHI1 goes high. The bootstrapping of node 36 to twice the $V_{DD}$ voltage turns on transistor 30 fully, allowing it to pass the full voltage of PHI1 to the load on output node 40.

When IN at node 13 switches high, while clock input PHI2 is also high, the bootable node 36 is discharged to ground. As PHI2 goes low and PHI1 switches high, there is no appreciable booting on node 36 and transistor 30 will remain in the off state.

In the preferred embodiment, the P-channel transistor 20 has a width/length ratio that is about the same as the width/length ratio of the N-channel transistors 22 and 24. The depletion transistor 22 has a width/length ratio of about 10/5. The enhancement transistor 30 is relatively small, since its primary function is to hold the load at a low level when clock input PHI2 is high and the driver transistor 28 is off. The enhancement transistor 28 is sized to drive the load high within the desired rise time.

In a preferred embodiment, a precharge/discharge decoder circuit can be used to control the input signal IN of the driver 10. The latching bootstrap driver 10 of the present invention is readily integrable with an integrated circuit utilizing a minimum number of components and on-chip area. What is provided, therefore, is an improved latching bootstrap driver with $V_{DD}*2$ booting.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. In a bootstrap driver circuit with $V_{DD}*2$ booting for driving an output node in response to an input signal on an input node, comprising:
   bootstrapped driver means, coupled between said input node and said output node and having a bootstrap node for receiving complementary clock signals having a precharge phase and a drive phase, for precharging said bootstrap node in response to said input signal during the precharge phase, and driving said output node in proportion to the charge on said bootstrap node during the drive phase;
   the improvement comprising:
   inverting latching buffer means, coupled between said driver means and said input node, for coupling said driver means to said input node only during said precharge phase.

2. The circuit of claim 1 wherein the buffer means comprises:
   inverting buffer means, coupled between said driver means and said input node, for coupling said driver means to said input node only when enabled; and
   latch means coupled to said inverting latching buffer means for disabling said inverting buffer means during said drive phase.

3. The bootstrap driver of claim 2 wherein the inverting buffer means comprises:

a first transistor having a control electrode coupled to said input node, a first current electrode connected to a first power supply terminal, and a second current electrode coupled to the driver circuit; and
   a second transistor having a control electrode coupled to said input node, a first current electrode coupled to the second current electrode of the first transistor, and a second current electrode.

4. The bootstrap driver circuit of claim 3 wherein the latching means comprises:
   a third transistor having a control electrode coupled to a precharge clock node, a first current electrode coupled to the second current electrode of the second transistor, and a second current electrode coupled to a second power supply node.

5. In a bootstrap driver circuit comprising:
   a first transistor having a control electrode coupled to a precharge clock node, a first current electrode coupled to an input node, and a second current electrode coupled to a bootstrap node;
   a second transistor having a control electrode coupled to the bootstrap node, a first current electrode coupled to a drive clock node, and a second current electrode coupled to an output node; and
   a third transistor having a control electrode coupled to the precharge clock node, a first current electrode coupled to the output node, and a second current electrode coupled to a first power supply node;
   the improvement comprising:
   a fourth transistor, coupled between the first current electrode of said first transistor and said input node, said fourth transistor having a control electrode coupled to said input node, a first current electrode connected to a second power supply terminal, and a second current electrode coupled to the first current electrode of said first transistor;
   a fifth transistor, coupled between the first current electrode of said first transistor and said input node, said fifth transistor having a control electrode coupled to said input node, a first current electrode coupled to the first current electrode of the first transistor, and a second current electrode; and
   a sixth transistor having a control electrode coupled to said precharge clock node, a first current electrode coupled to the second current electrode of the fifth transistor, and a second current electrode coupled to said first power supply node.

* * * * *